(12) United States Patent
De Groot et al.

(10) Patent No.: US 7,392,417 B2
(45) Date of Patent: Jun. 24, 2008

(54) DEVICE FOR EXCHANGING DATA SIGNALS BETWEEN TWO CLOCK DOMAINS

(75) Inventors: Hermana Wilhelmina Hendrika De Groot, Eindhoven (NL); Roland Mattheus Maria Hendricus Van Der Tuijn, Mouans Sartoux (FR)

(73) Assignee: NXP B.V., Eindhoven (NL)

( * ) Notice: Subject to any disclaimer, the term of this patent is extended or adjusted under 35 U.S.C. 154(b) by 39 days.

(21) Appl. No.: 10/532,294

(22) PCT Filed: Oct. 6, 2003

(86) PCT No.: PCT/IB03/04408

§ 371 (c)(1),
(2), (4) Date: Apr. 21, 2005

(87) PCT Pub. No.: WO2004/038994

PCT Pub. Date: May 6, 2004

(65) Prior Publication Data

US 2006/0212618 A1 Sep. 21, 2006

(51) Int. Cl.
*H03M 9/00* (2006.01)

(52) U.S. Cl. .................... 713/400; 713/375; 713/401; 711/109; 710/58; 710/71; 365/189.12; 341/100

(58) Field of Classification Search ............... 713/375, 713/400, 401; 711/109; 710/58, 71; 365/189.12; 341/100
See application file for complete search history.

(56) References Cited

U.S. PATENT DOCUMENTS

| | | | | |
|---|---|---|---|---|
| 5,420,583 A | * | 5/1995 | Knecht et al. | 341/59 |
| 5,463,630 A | * | 10/1995 | Tooher | 370/535 |
| 5,508,967 A | * | 4/1996 | Karino | 365/219 |
| 5,619,506 A | | 4/1997 | Burch et al. | |
| 5,915,128 A | * | 6/1999 | Bauman et al. | 710/60 |
| 5,926,120 A | * | 7/1999 | Swenson et al. | 341/100 |
| 6,215,727 B1 | * | 4/2001 | Parson et al. | 365/233 |
| 6,509,851 B1 | * | 1/2003 | Clark et al. | 341/100 |
| 6,768,431 B2 | * | 7/2004 | Chiang | 341/100 |
| 6,775,328 B1 | * | 8/2004 | Segaram | 375/257 |
| 6,829,191 B1 | * | 12/2004 | Perner et al. | 365/220 |
| 6,888,480 B1 | * | 5/2005 | Chan et al. | 341/59 |
| 7,016,346 B1 | * | 3/2006 | Alowersson et al. | 370/363 |
| 7,148,826 B2 | * | 12/2006 | Kanazashi | 341/100 |

* cited by examiner

*Primary Examiner*—Abdelmoniem Elamin
(74) *Attorney, Agent, or Firm*—Peter Zawilski

(57) ABSTRACT

A device for transferring data signals between a first clock domain and a second clock domain comprises a serial memory element and a parallel memory element which are coupled. The serial memory element comprises at least one extra memory position more than the parallel memory element for the storage of the data signals.

10 Claims, 3 Drawing Sheets

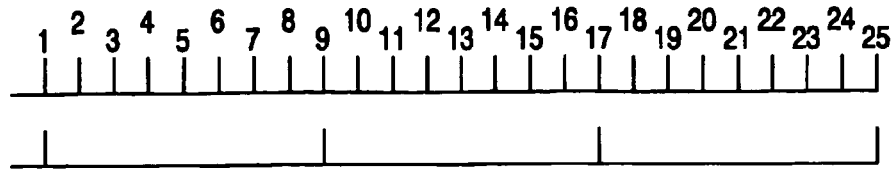
FIG. 2a
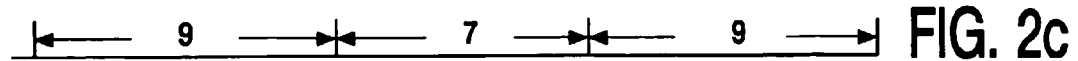
FIG. 2b
FIG. 2c
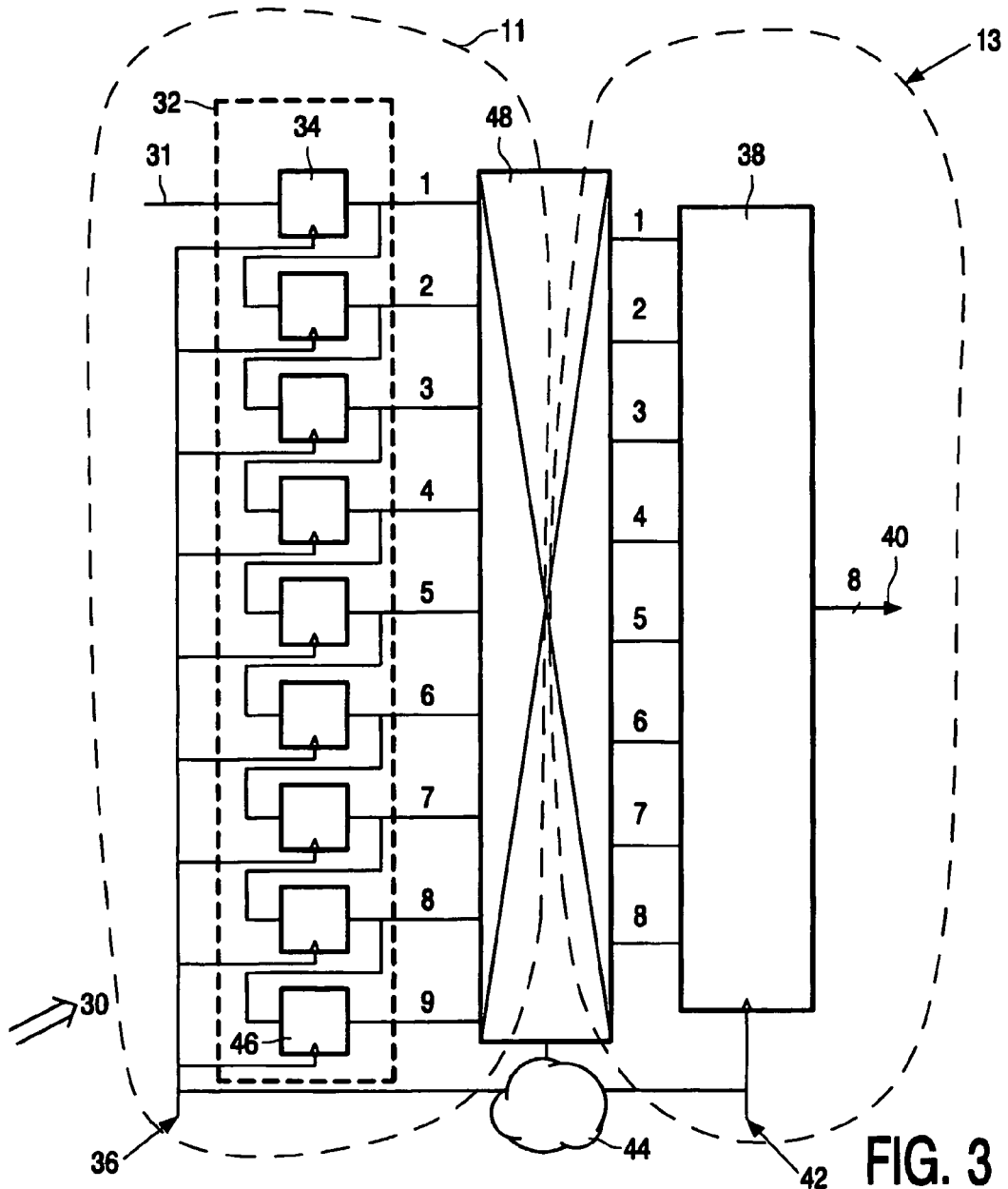
FIG. 3

DEVICE FOR EXCHANGING DATA SIGNALS BETWEEN TWO CLOCK DOMAINS

The present invention relates to a device for exchanging data signals between a first clock domain and a second clock domain.

U.S. Pat. No. 5,619,506 describes how waiting time jitter can be reduced in a pulse stuffing synchronization system for synchronizing a data signal with a synchronized clock signal. The method comprises monitoring the pulse stuffing ratio. If the pulse stuffing ratio exceeds a prescribed maximum ratio, the frequency of the synchronized clock signal will be changed, so that the amount of jitter can be reduced.

The disadvantage of this method, however, is that it is not always feasible or allowed to adapt the synchronized clock signal. Generally this will only be feasible in situations where the pulse stuff synchronizing system is the clock master. Moreover, the stuffing of bits introduces errors in the data stream. In certain cases this may cause problems to occur. In this respect one may think of the case where the data signals are audio samples. In this situation the stuffed bits may be the cause of audible distortions in the audio signal.

It is an object of the present invention to synchronize a data signal from a first clock domain with a clock signal from a second clock domain while jitter is reduced without adaptation of clock signals being necessary then. This object is achieved in that the device comprises a serial memory element and a parallel memory element coupled to the serial memory element, the serial memory element comprising at least one memory location more for the data signals than the parallel memory element.

By having data signal transfer between the two clock domains effected via a parallel and a serial memory element coupled to each other, the serial memory element comprising at least one memory location more, excess storage capacity is generated. As a result, bits that are written in excess can be stored temporarily. In this way less data is lost and fewer bit stuffs are needed then.

A further embodiment according to the invention is characterized in that a first control signal, for writing the data signals into the serial memory element, can be derived from a first clock signal that is designed to synchronize the data signals in the first clock domain, and in that a second control signal, for reading the data signals from the parallel memory element, can be derived from a second clock signal that is designed to synchronize the data signals in the second clock domain. This makes the writing in the serial memory element dependent on a first clock signal with which the data signals are read into the first clock domain. Reading from the parallel memory element is made dependent on a second clock signal with which data signals in the second clock domain are synchronized.

A next embodiment according to the invention is characterized in that a third control signal, for reading the data signals from the serial memory element, can be derived from a first clock signal that is designed to synchronize the data signals in the first clock domain, and in that a fourth control signal, for writing the data signals in the parallel memory element, can be derived from a second clock signal that is designed to synchronize data signals in the second clock domain. In consequence, the control signals for writing in the parallel memory element become dependent on the clock signal in the second clock domain and reading from the serial memory element becomes dependent on the clock signal from the first clock domain.

A further embodiment according to the invention is characterized in that the device is designed to adapt a data signal sampling rate. This allows to exchange signals between clock domains when the signals have been sampled with different frequencies in each clock domain.

Another embodiment according to the invention is characterized in that the device is designed to change a modulation scheme of the data signals. This allows the transfer of signals between clock domains in which data signals are modulated differently.

FIG. 2 shows several jitter effects,

FIG. 3 shows a first embodiment according to the present invention,

Figure 1:
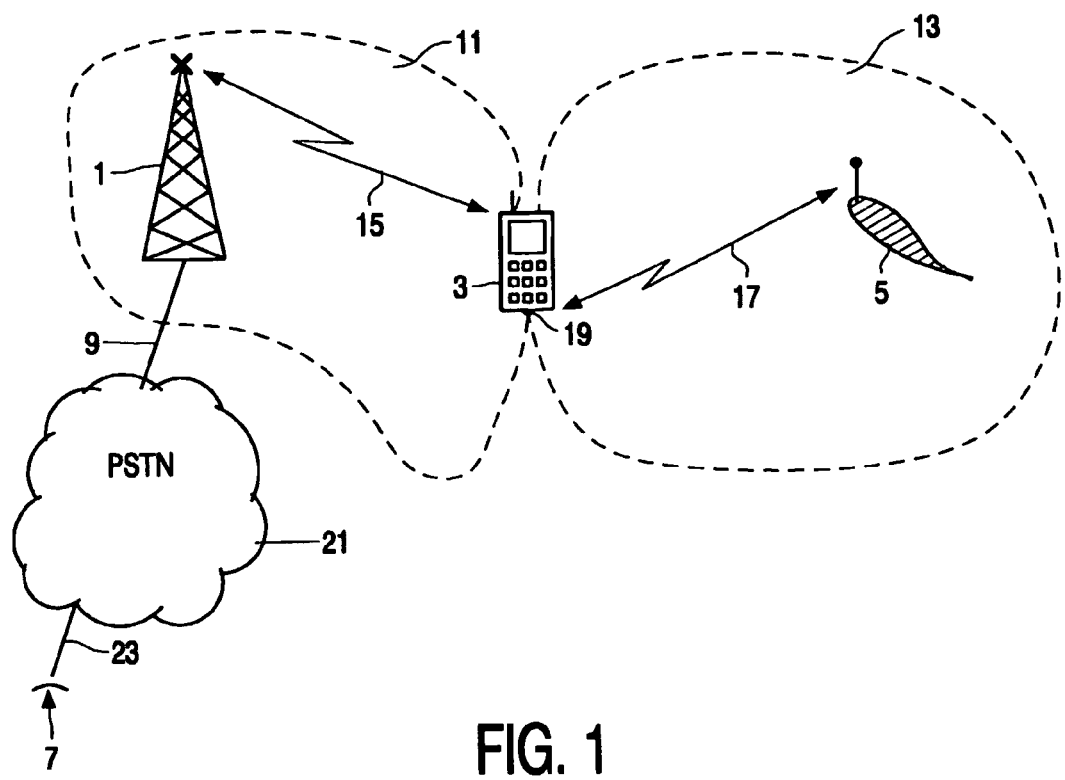
FIG. 1 shows a possible application of the present invention.

FIG. 1 shows a possible application of the present invention in which the data signals are audio samples. In FIG. 1 a user holds a conversation with another user via a wireless headset 5 which other user has a stationary telephone 7. To make communication possible between the two users 5, 7, a connection is to be established between the wireless headset 5 and the stationary telephone 7. This connection consists of various elements. To begin with, a wireless connection 17 between the wireless headset 5 and the associated transceiver 19 and then a wireless connection 15 between the mobile phone 3 and the base station 1. Both the base station 1 and the stationary telephone 7 are connected by the lines 9 and 7 respectively to the Public Switched Telephone Network PSTN 21. During the conversation the wireless headset 5 will convert speech into audio samples and send them on to the transceiver 19 over the line 17. Conversely, the wireless headset 5 will decode the audio samples it receives from the transceiver 19 and convert them into an understandable message.

In FIG. 1 two clock domains 11, 13 are defined. A clock domain in this context is a fictitious domain within which the audio samples are synchronized with one clock signal or a signal derived therefrom. The clock signal from the first clock domain 11 is determined by the base station 1, the clock signal from the second clock domain 13 being determined by the wireless headset 5. For this reason, the moment the audio samples change from the one clock domain to the other 11 or 13, the synchronization of the audio sample is to change with them. To this end as it were the existing synchronization in the old clock domain is to be decoupled and replaced by the synchronization signal in the new clock domain.

Figure 5:
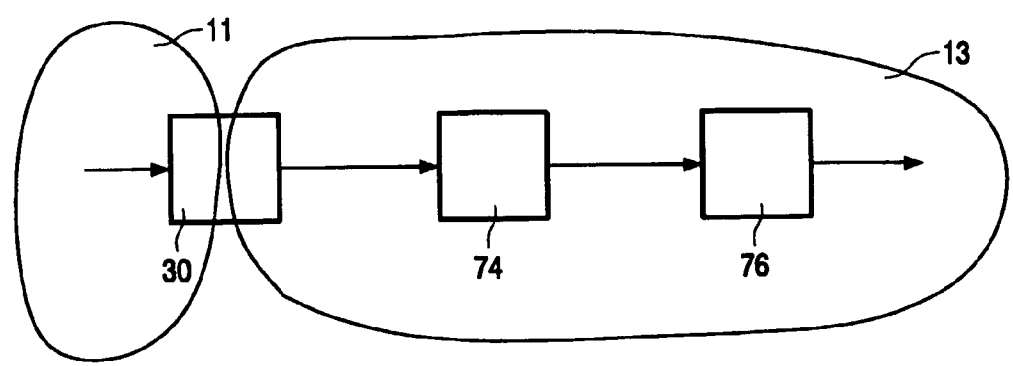
FIG. 5 shows a third embodiment according to the present invention.

FIG. 2 shows several effects from jitter. FIG. 2 shows in a) 25 pulses of a reference signal. FIG. 2 shows in b) a second signal that is synchronous with the reference signal. In this context synchronous is understood to mean that two consecutive pulses of the signal are always equidistant to each other and that these pulses in addition always coincide with the pulses of the reference signal. FIG. 5 shows in c) a signal that is affected by jitter, i.e. the distance between two consecutive pulses is no longer constant and, what is more, the pulses no longer coincide with the pulses from the reference signal. A property of jitter is that it causes brief deviations to occur in the clock frequency while on average the clock frequency is stable over time. It is exactly this property that makes it possible to reduce the effects of jitter on data signals.

FIG. 3 shows a device 30 according to the invention in which data signals are transferred between a first clock domain 11 and a second clock domain 13. By way of example it is assumed that the data signals in the first clock domain have a 1 bit word length. This is the case, for example, when the data signals in the first clock domain are audio samples which are 1 bit Deltacode modulated. By way of example it is further assumed that the parallel memory element has an 8 bit word length whereas the serial memory element is arranged to contain one bit more. The data signals from the first clock domain 11 are written in the serial memory element 32 through an input 31, which serial memory element 32 is formed by a number of mutually coupled buffers 34 by way of illustration. The clock signal from the first clock domain 11 is used to generate the write pulses necessary for this purpose. Subsequently, the serially written data signals are read out in parallel from the second clock domain 13 via the parallel memory element 38 and a bus 40.

The pulses of the clock signal 42 from the second clock domain 13 are used to generate the required reading pulses. The control mechanism 44 inter alia provides for the writing and reading operations not to coincide, so that always stable situations are started from. Moreover, the control mechanism 44 drives a transfer unit 48 by which the data in the serial memory element 32 is written in parallel in the parallel memory element. Since the serial memory element 32 contains one memory location 46 more than the parallel memory element 38, data signals that have erroneously been written in excess in the serial memory element 32 owing to jitter, are saved until a next write/read cycle. In consequence, no data is lost.

It may be evident that different word lengths of the data signals, the serial memory element and the parallel memory element are also possible, and that the man of ordinary skill in the art may extend at will the structure presented here. In addition, the memory element may contain various additional memory locations which depends on the amount of jitter that may statistically be expected. In the further discussion of the embodiment it is assumed that the data signals are audio samples having a word length of 1 bit.

Although ideally first 8 audio samples are written in the serial memory element (32) before they can be read out from the second clock domain, it may happen that as a result of jitter sometimes more and sometimes fewer audio samples are written than intended.

If 7 audio samples are written in the serial memory element 32 and if there is no additional audio sample present yet, one audio sample will be doubled so that still 8 audio samples can be read out in parallel from the second clock domain 13 over bus 40. A sample error is introduced as a result. If there is an audio sample present indeed in the serial memory element 32, this audio sample will be used as yet, so that 8 samples can be read out in parallel from the second clock domain 13.

If 8 audio samples are written in the serial memory element 32 and if there is no additional audio sample present yet, these 8 audio samples will all be read out from the second clock domain 13. If, however, there is already one audio sample present in the serial memory element, this additional audio sample will be read from the second clock domain 13 while the sample serially written last is saved for use in a next cycle. This avoids data loss because otherwise the audio sample already present would have been overwritten. In this context it should be realized that the order of the audio samples as such is not affected by this procedure.

If 9 audio samples are written in the serial memory element 32 and if there is no additional audio sample present yet, no more than 8 audio samples will then be written in parallel. The ninth and last audio sample is saved in the extra memory location 46 to be used in a next cycle. If, however, there is already one audio sample present in the serial memory element 32, this audio sample will be lost when 9 audio samples are written during the cycle. So this introduces an error.

Figure 4:
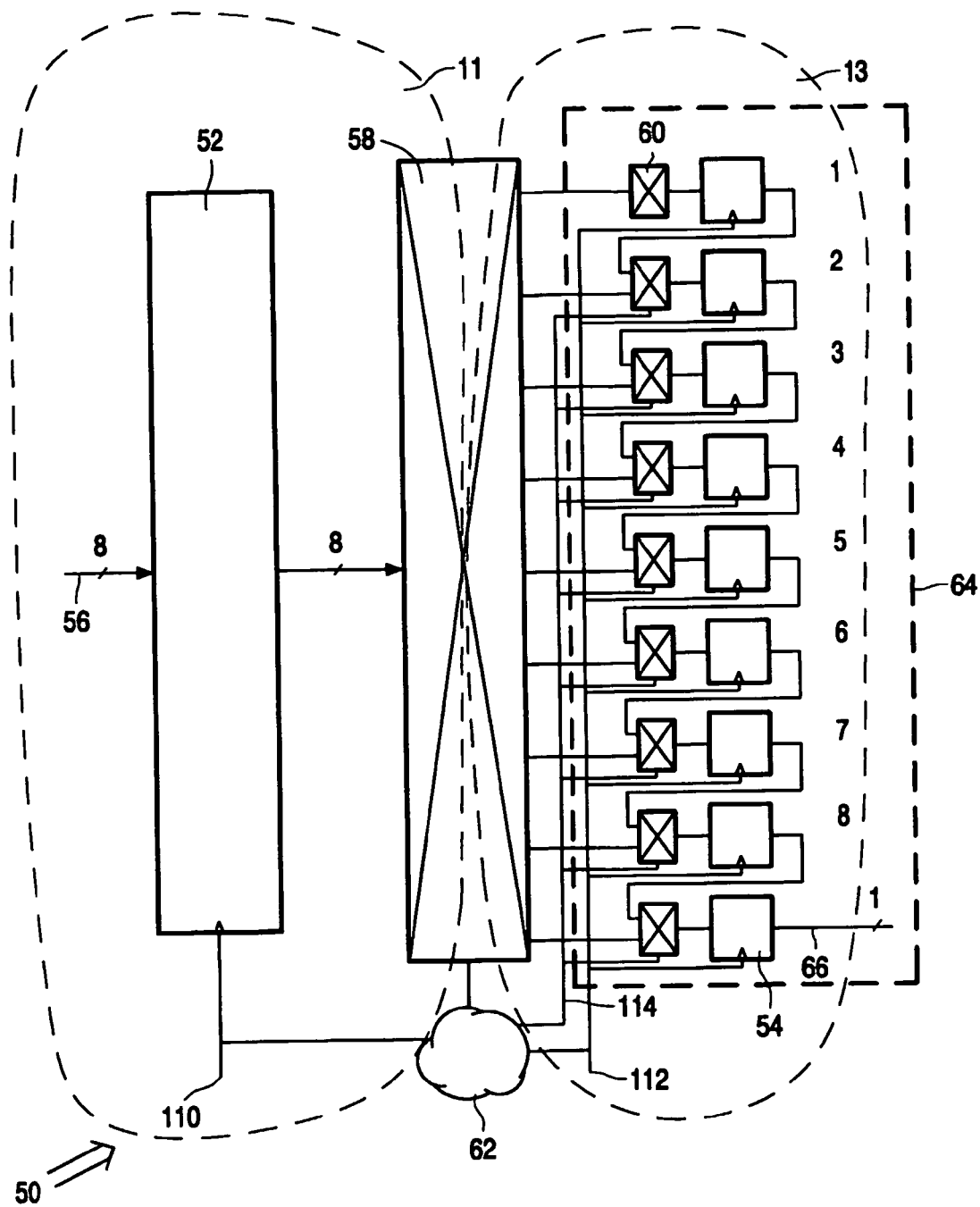
FIG. 4 shows a second embodiment according to the present invention.

FIG. 4 shows a further device 50 according to the invention. The word length of the parallel memory element 52 is 8 bits. The serial memory element has one memory location 54 more, so that there is room for 9 bits. It may be obvious that other word lengths of the serial memory element and the parallel memory element are also possible. This depends on the type of data signals and the jitter statistically to be expected. By way of illustration in FIG. 4 it is assumed that the data signals are audio samples having a 1 bit word length.

At all events and purposes 8 audio samples are written in parallel in the memory element 52 over a bus 56. These 8 audio samples are subsequently written in parallel in the serial memory element 64, transfer unit 58 and multiplexers 60. The latter are driven by control unit 62, which provides inter alia that always stable situations are started from. This avoids, for example, simultaneous reading and writing operations. Once the 8 audio samples have been written in the serial memory element 64 in parallel, they are serially read out from the second clock domain 13 through an output 66. However, as a result of jitter sometimes more and sometimes fewer than 8 audio samples will be read out. Assuming that 8 audio samples have already been written in parallel in the serial memory element 64 in parallel, the operation of the device is the following:

- If the serial memory element 64 contains 8 audio samples and if then 7 samples are serially read from the second clock domain, one audio sample will be left in the serial memory element 64. After again 8 audio samples have been written in the serial memory element 64 during the next cycle, the serial memory element is 'full'. This means that is contains 9 audio samples.
- If the serial memory element 64 contains 8 audio samples and if all of them are then read out from the second clock domain, there will be mention of an errorless cycle.
- If the serial memory element 64 contains no more than 8 audio samples, but if 9 audio samples are read out in series, one sample is copied (stuffed) so that a sample error is introduced.
- If the serial memory element 64 contains nine audio samples and if only 7 audio samples are read out, 2 audio samples will stay behind in the serial memory element 64. If again 8 audio samples are written in the serial memory element 64 from the parallel memory element 52 during a next cycle, one sample will be lost during this action, because the serial memory element 64 is designed to have a maximum capacity of 9 audio samples.
- If the serial memory element 64 contains nine audio samples and if 8 audio samples are read out, one audio samples will stay behind, which can be used during a next cycle.
- If the serial memory element 64 contains nine audio samples and if all of them are read from the second clock domain, the serial memory element 64 will be empty.

By combining the embodiments as shown in FIGS. 3 and 4, it is possible also to design parallel-to-parallel and serial-to-serial converters.

FIG. 5 shows a further embodiment according to the invention. It is then assumed that the data signals 34 from the first clock domain 11 are sampled at a higher sample rate than the data signals 36 from the second clock domain 13. In addition, the data signals 34 are modulated in accordance with a different modulation scheme than the data signals from the second clock domain. For example, the data signals in the first clock domain may be 64 kHz Deltacode modulated audio samples, whereas the data signals in the second domain are 8 kHz PCM modulated signals. In FIG. 5 the 64 kHz Deltcode modulated audio samples from the first clock domain 11 are clustered in parallel, so that they are serially written in the second clock domain 13 via device 3.0 from FIG. 4. It is true, the result is that the audio samples are now synchronized with the clock signal from the second clock domain, but the modulation and the clock frequency are still to be adapted. To this end first the modulation scheme of the audio samples is changed from Delta modulation to PCM. This is effected in transcoder 74. Such a transcoder is known, for example, from the Bluetooth specification version 1.1, part B. Subsequently, also the clock frequency of the audio samples is adapted. In this example this means that the sample rate of the audio samples is to be reduced by a factor of eight. Decimator 76 is used for this purpose.

Figure 6:
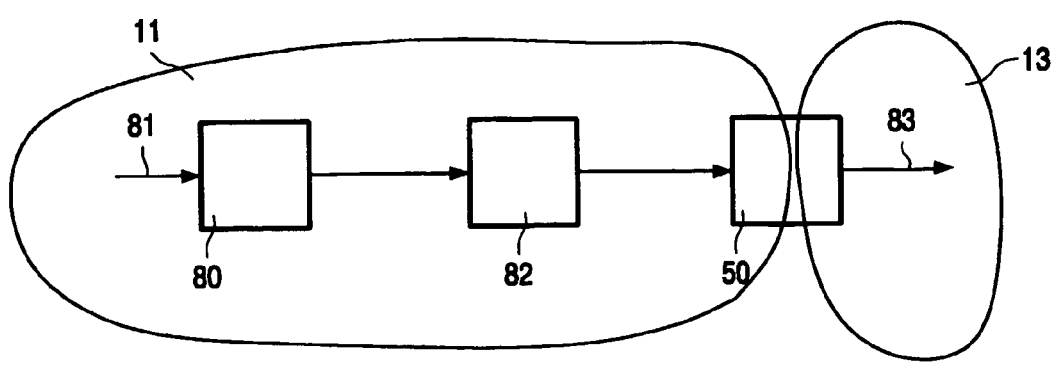
FIG. 6 shows a fourth embodiment according to the present invention.

FIG. 6 shows another embodiment according to the invention. In this context it is assumed that the data signals 83 from the second clock domain 13 are sampled at a higher sample rate than the data signals 81 from the first clock domain 11. Moreover, the data signals 81 are supposed to be modulated according to a different modulation scheme than the data signals 83. For example, the data signals 81 in the second clock domain 11 may be 64 kHz Deltcode modulated audio samples, whereas the data signals 83 in the second clock domain 13 are 8 kHz PCM modulated data signals. It is assumed that the data signals (81) from the first clock domain 11 are serially clustered, whereas the data signals 83 from the second clock domain 13 are clustered in parallel. Since the sample rate of the data signals 81 in the first clock domain 11 is lower than the sample rate in the second clock domain 13, first the data signal is oversampled and interpolated 80. Then, via the transcoder 82, the modulation scheme of the signals is changed from PCM to Deltcode modulation. Finally, the data signals are written in the second clock domain via device 50 from FIG. 5, while the audio samples are synchronized with the clock signal from the second clock domain 13.

It is possible not to reduce the sample rate of the data signals until the moment when the data signals have already been synchronized with the clock signal from the second clock domain. However, this would mean that the synchronization would take place when the data signals would have the lowest sample rate. Instantaneous deviations in the data signal, which signal may be for example an audio sample, could then lead to audible distortions. Seen in this perspective it is advisable not to reduce the sample rate of the data signals until the data signal has been synchronized with the clock signal from the second clock domain. Obviously, the reverse also holds true, that is to say, if applicable, the sample rate of the data signals is to be increased before the data signals are synchronized.

The term 'a' or 'an' does not exclude 'a or a plurality of'. Data signals may be audio signals.

The invention claimed is:

1. A device for exchanging data signals between a first clock domain and a second clock domain, characterized in that the device comprises a serial memory element in which successive data elements are shifted in order from one memory location to a next successive memory location, and a parallel memory element coupled to the serial memory element, the serial memory element comprising at least one memory location more for the data signals than the parallel memory element.

2. A device as claimed in claim 1, characterized in that the serial memory element is arranged for writing the data signals and the parallel memory element is arranged for reading out the data signals.

3. A device as claimed in claim 2, characterized in that a first control signal for writing the data signals in the serial memory element can be derived from a first clock signal which is arranged for synchronizing the data signals in the first clock domain, and in that a second control signal for reading the data signals from the parallel memory element can be derived from a second clock signal which is arranged for synchronizing the data signals in the second clock domain.

4. A device as claimed in claim 1, characterized in that the serial memory element is arranged for reading out the data signals and in that the parallel memory element is arranged for writing the data signals.

5. A device as claimed in claim 4 characterized in that a third control signal for reading the data signals from the serial memory element can be derived from a first clock signal which is arranged for synchronizing the data signals in the first clock domain, and in that a fourth control signal for writing the data signals in the parallel memory element can be derived from a second clock signal which is arranged for synchronizing data signals in the second clock domain.

6. A device as claimed in claim 1, characterized in that the device is arranged for adapting a sample rate of the data signals.

7. A device as claimed in claim 1, characterized in that the device is arranged for changing a modulation scheme of the data signals.

8. A device as claimed in claim 1, characterized in that the data signals are audio samples.

9. A module for transferring data signals between a first and a second clock domain, comprising a device as defined in claim 1.

10. A device for transferring data signals between a first and a second clock domain, comprising a module as claimed in claim 9.

* * * * *